(12) United States Patent
Neal et al.

(10) Patent No.: US 11,832,419 B2
(45) Date of Patent: Nov. 28, 2023

(54) FULL PACKAGE VAPOR CHAMBER WITH IHS

(71) Applicant: Intel Corporation, Santa Clara, CA (US)

(72) Inventors: Nicholas Neal, Gilbert, AZ (US); Nicholas S. Haehn, Scottsdale, AZ (US); Je-Young Chang, Tempe, AZ (US); Kyle Arrington, Gilbert, AZ (US); Aaron McCann, Queen Creek, AZ (US); Edvin Cetegen, Chandler, AZ (US); Ravindranath V. Mahajan, Chandler, AZ (US); Robert L. Sankman, Phoenix, AZ (US); Ken P. Hackenberg, Plano, TX (US); Sergio A. Chan Arguedas, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 828 days.

(21) Appl. No.: 16/723,865

(22) Filed: Dec. 20, 2019

(65) Prior Publication Data

US 2021/0195798 A1    Jun. 24, 2021

(51) Int. Cl.
*H05K 7/20* (2006.01)
*H01L 23/498* (2006.01)
(Continued)

(52) U.S. Cl.
CPC ..... *H05K 7/20309* (2013.01); *H01L 23/3672* (2013.01); *H01L 23/49816* (2013.01); *H01L 24/14* (2013.01)

(58) Field of Classification Search
CPC ........... H01L 2224/73253; H01L 23/42; H01L 2924/15311; H01L 23/367; H01L 23/22;
(Continued)

(56) References Cited

U.S. PATENT DOCUMENTS

| 6,559,536 | B1 * | 5/2003 | Katoh | ................... H01L 24/32 257/713 |
| 2003/0197252 | A1 * | 10/2003 | Budelman | ............. H01L 23/427 257/E23.088 |

(Continued)

*Primary Examiner* — Mandeep S Buttar
(74) *Attorney, Agent, or Firm* — Schwabe, Williamson & Wyatt, P.C.

(57) ABSTRACT

Embodiments include semiconductor packages. A semiconductor package includes dies on a package substrate, an integrated heat spreader (IHS) with a lid and sidewalls over the dies and package substrate, and a heatsink and a thermal interface material respectively on the IHS. The semiconductor package includes a vapor chamber defined by a surface of the package substrate and surfaces of the lid and sidewalls, and a wick layer in the vapor chamber. The wick layer is on the dies, package substrate, and IHS, where the vapor chamber has a vapor space defined by surfaces of the wick layer and lid of the IHS. The sidewalls are coupled to the package substrate with a sealant that hermetically seals the vapor chamber with the surfaces of the package substrate and the sidewalls and lid. The wick layer has a uniform or non-uniform thickness, and has porous materials including metals, powders, or graphite.

26 Claims, 7 Drawing Sheets

(51) Int. Cl.
*H01L 23/00* (2006.01)
*H01L 23/367* (2006.01)

(58) Field of Classification Search
CPC ......... H01L 23/315; H01L 23/34; G06F 1/20; H05K 7/20309; H05K 7/20336; H05K 7/2039
USPC .... 438/122, 118, 15, 106; 165/80.4, 104.33, 165/104.28; 257/714, 687, 707, 712; 361/689, 697, 698, 699, 700
See application file for complete search history.

(56) References Cited

U.S. PATENT DOCUMENTS

| | | | | |
|---|---|---|---|---|
| 2005/0068737 | A1* | 3/2005 | Leija | H01L 23/467 257/E23.099 |
| 2008/0053640 | A1* | 3/2008 | Mok | F28D 15/02 257/E23.091 |
| 2008/0283222 | A1* | 11/2008 | Chang | H01L 23/427 165/104.26 |
| 2009/0001556 | A1* | 1/2009 | Sun | H01L 24/29 257/E23.106 |
| 2009/0085198 | A1* | 4/2009 | Vadakkanmaruveedu | H01L 23/427 257/714 |
| 2009/0298235 | A1* | 12/2009 | Kostiew | H01L 23/42 438/118 |
| 2010/0117209 | A1* | 5/2010 | Bezama | H01L 25/065 257/E23.141 |
| 2011/0129963 | A1* | 6/2011 | Kostiew | H01L 21/50 438/118 |
| 2013/0258599 | A1* | 10/2013 | Danello | H01L 23/433 361/706 |
| 2014/0247556 | A1* | 9/2014 | Eid | H01L 23/3675 29/592.1 |
| 2017/0084514 | A1* | 3/2017 | Kumari | H01L 23/34 |
| 2017/0092561 | A1* | 3/2017 | Eid | H01L 21/4878 |
| 2019/0035713 | A1* | 1/2019 | Prajapati | H05K 7/20336 |
| 2021/0029855 | A1* | 1/2021 | Yoon | H01L 23/42 |
| 2022/0011054 | A1* | 1/2022 | Hanano | H01L 23/427 |
| 2022/0375814 | A1* | 11/2022 | Yu | H01L 23/3128 |

* cited by examiner

FULL PACKAGE VAPOR CHAMBER WITH IHS

FIELD

Embodiments relate to packaging semiconductor devices. More particularly, the embodiments relate to semiconductor devices having integrated heat spreaders with full package vapor chambers.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as microelectronic packages, while optimizing the performance of each device, however is not without issue.

One main issue involves the thermal management of such packages. For example, thermal management of microelectronic packages is becoming extremely important as the power requirements and the number of dies of the microelectronic packages steadily increase. Additionally, thermal issues of microelectronics packages continue to increase all the time due to more confined environments, higher power densities, and advanced packaging techniques that typically do not work well with traditional cooling solutions.

Most existing packaging solutions typically use traditional cooling solutions such as finned fan convection-style air heatsinks and finned liquid-cooled heat exchangers, but more advanced cooling solutions such as thermoelectric coolers, heat (or vapor) chambers, and heat pipes have also been used. However, all of these cooling solutions are still subject to the increased thermal resistance of the thermal interface materials, contact resistances, package warpage, and cross-talk between the high-power dies to the low-power dies.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
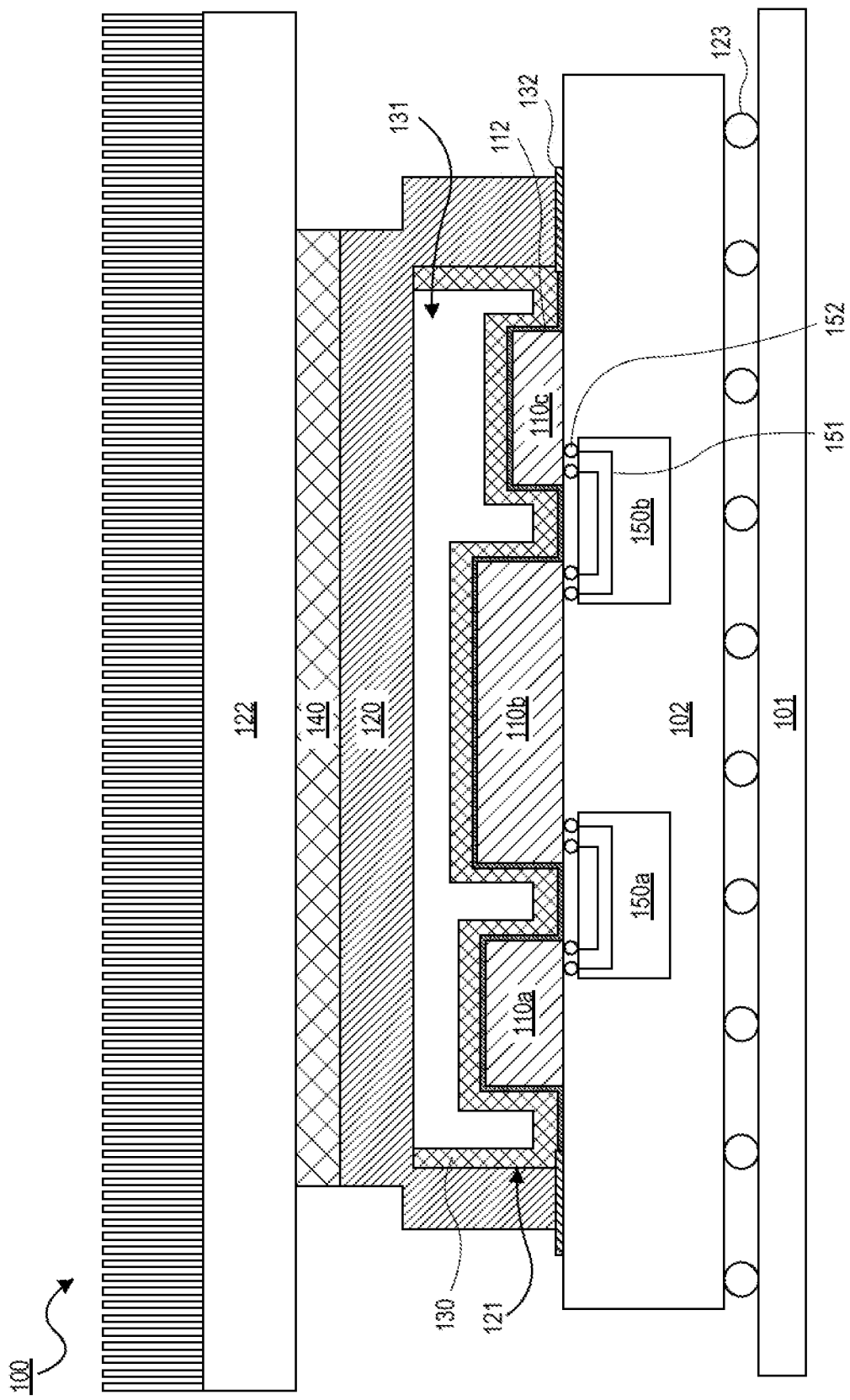
FIG. 1 is an illustration of a cross-sectional view of a semiconductor package with a heatsink, a thermal interface material (TIM), an integrated heat spreader (IHS), a vapor chamber, a wick layer, a plurality of dies, a package substrate, and a substrate, according to one embodiment.

Described herein are semiconductor packages having integrated heat spreaders with full package vapor chambers and methods of forming such semiconductor packages. The semiconductor packages described below and methods of forming such semiconductor packages may include a heatsink, a thermal interface material (TIM), an integrated heat spreader (IHS) with a lid and a plurality of sidewalls, a vapor chamber, a wick layer (or a layer comprised of wick materials), one or more dies (or a plurality of dies), a package substrate, and a substrate.

In the embodiments described below, the semiconductor package has the IHS directly disposed on the package substrate, where a sealant (or the like) hermetically seals the sidewalls of the IHS onto the top surface of the package substrate. Accordingly, in these embodiments, the top surface of the package substrate may be implemented with the lid and sidewalls of the IHS to define (or implement/dispose) a vapor chamber that is hermetically sealed and integrated within (or between) the IHS and the package substrate of the semiconductor package.

As described herein, a "vapor chamber" may refer to a chamber (or a chamber-like structure, an enclosure, etc.) defined (or implemented) by a surface of the package substrate, a surface of the lid of the IHS, and a surface of the sidewalls of the IHS. That is, in the embodiments described herein, the top surface of the chamber may be defined by the bottom surface of the lid of the IHS; the side surfaces (or walls/edges) of the chamber may be defined by the interior surface(s) (or inner surface(s)) of the sidewalls of the IHS; and the bottom surface of the chamber may be defined by the top surface of the package substrate. In particular, as described herein, the "vapor chamber" may refer to a chamber that is fully surrounded (or enclosed) and integrated within (or in between) the IHS and the package substrate, where the chamber is also hermetically sealed by directly coupling (or attaching, sealing, etc.) the sidewalls of the IHS onto the package substrate with a sealant (or the like).

As such, as described above and the embodiments herein, the "vapor chamber" may be a hermetically sealed chamber defined by the surfaces of the IHS and package substrate of the semiconductor package, where the hermetically sealed chamber may further include a wick layer, a vaporizing liquid (e.g., a liquid/fluid having a gas form and a liquid form), and a vapor space that surround the respective dies and help transfer/direct heat (or energy) generated by the dies evenly (or spread out) to the lid of the IHS and the heatsink (as described below in further detail). Note that, in these embodiments, the "vapor chamber" described herein may thus be (i) implemented without a TIM (or the like) being positioned between the dies and the IHS, and (ii) fully integrated and defined within the IHS and package substrate (i.e., the vapor chamber may be implemented without being a separate (or isolated) sealed component that may be respectively combined with the IHS and the package substrate).

The embodiments of the vapor chamber described herein provide improvements to existing packaging solutions by substantially reducing the maximum die temperatures, and increasing the thermal design power (TDP) capabilities of the semiconductor packages described herein. These improvements are due to the extremely good heat spreading capabilities of the embodiments of the vapor chamber as well as the removal of one of the typically used TIMs. That is, the typical (or existing) IHS spreads the heat from the package dies out to the main cooling device (e.g., a liquid/air heatsink), but much of the heat remains near the center of the heatsink and centralized over the dies and the package substrate. Additionally, this IHS typically uses two or more TIMs (e.g., TIM1 and TIM2) to direct/transfer the heat from the dies to the IHS and then the IHS to the heatsink, where the TIM1 is positioned between the top surfaces of the dies and the bottom surface of the lid of the IHS, and the TIM2 is positioned between the top surface of the lid of the IHS and the back surface of the heatsink. These TIMs and the associated contact resistances of the TIMs are the primary driver in the overall thermal resistance of such packages.

As such, the embodiments described herein improve the typical packaging solutions by completely removing the TIM between the dies and the IHS, and by instead implementing the IHS directly onto the package substrate with the hermetically sealed vapor chamber. Additionally, these embodiments thus enable the semiconductor package to utilize the improvements (or benefits) of the vapor chamber, such as the improved heat spreading performance that allows the heat to uniformly spread onto the bottom surface of the heatsink and also evenly spread out from one outer region to the opposite outer region of the heatsink (i.e., the heat does not remain near the center of the heatsink nor centralized over the dies and the package substrate); while also substantially reducing the thermal resistances associated with the TIM1, maintaining a desired low profile (or overall thickness/z-height), and directly integrating the vapor chamber with the IHS and the package substrate— without the vapor chamber being a separate, sealed unit.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages heatsinks, TIMs, IHSs, vapor chambers, wick layers, dies, package substrates with embedded bridges, and substrates.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1, a cross-sectional illustration of a semiconductor package 100 is shown, in accordance with an embodiment. In some embodiments, the semiconductor package 100 may include a heatsink 122, a TIM 140, an IHS 120, a vapor chamber 121, a wick layer 130, a plurality of dies 110a-c, a package substrate 102, and a substrate 101, according to one embodiment. According to these embodiments, the dies 110a-c may be disposed on the package substrate 102, where the package substrate 102 is disposed and coupled onto the substrate 101 with a plurality of solder balls 123.

As shown in FIG. 1, in some embodiments, the IHS 120 may be implemented (or shaped/designed) with a lid and a plurality of sidewalls. As such, in these embodiments, the lid of the IHS 120 may be disposed over the dies 110a-c and the package substrate 102, where the sidewalls of the IHS 120 are disposed and coupled onto the top surface of the package substrate 102 with a sealant 132. In one embodiment, the sealant 132 may be comprised of a solder, a polymer, an epoxy, and/or the like. Furthermore, as described above and in these embodiments, the sidewalls of the IHS 120 are hermetically sealed onto the top surface of the package substrate 102 with the sealant 132, and are covered with the lid of the IHS 120 to define (or enclose) the vapor chamber 121. In some embodiments, the vapor chamber 121 is hermetically sealed and positioned (or embedded/surrounded) in between (or within) the inner surfaces of the IHS 120 and the top surface of the package substrate 102—and respectively surrounds the dies 110a-c on the package substrate 102.

The vapor chamber 121 may be implemented (or formed) using surfaces (and/or portions) of the IHS 120 and the package substrate 102. The vapor chamber 121 may include (or be defined by) one or more walls, surfaces, or boundary members, such as the interior surfaces of the sidewalls of the IHS 120, the interior surface (or the bottom surfaces) of the lid of the IHS 120, and the top surface of the package substrate 102. The one or more walls, surfaces, or boundary members of the vapor chamber 121 may define (or implement/form) a hermetically sealed/enclosed chamber (or housing) that surrounds the wick layer 130, the dies 110a-c, and a vapor space 131 (as described in further detail below). In some embodiments, since most vapor chambers are custom fitted to a particular device/electronic enclosure combination (e.g., the combination of the IHS 120, the package substrate 102, and the dies 110a-c), the vapor chamber 121 may have any regular or irregular shape, physical configuration, and/or thickness (or z-height).

Furthermore, in some embodiments, at least one or more surfaces (or portions) of the vapor chamber 121 may include, be disposed/coated with, or be implemented with the wick layer 130. That is, according to some embodiments, the wick layer 130 may be disposed over one or more portions of the surfaces of the dies 110a-c (e.g., the top and side surfaces of the dies 110a-c), the IHS 120 (e.g., the interior surfaces of the sidewalls of the IHS 120, and a portion of the bottom surface of the lid of the IHS 120), the package substrate 102 (e.g., the top surface of the package substrate 102), and/or the sealant 132. For example, the wick layer 130 may be deposited, attached, and/or grown over (or onto) the surfaces of the IHS 120, the dies 110a-c, the package substrate 102. Also, in one embodiment, the wick layer 130 may surround (or interface with) a portion of the sealant 132 based on the desired design of the vapor chamber 121, while, in an alternate embodiment, the wick layer 130 may not surround (or interface with) any portion of the sealant 132.

In some embodiments, the wick layer 130 may be comprised of one or more materials, where the one or more materials of the wick layer 130 may include at least one or more partially porous materials comprised of metals (e.g., copper-based metals, aluminum, etc.), sintered metallic powders, graphite, spun-on glass, porous silicon, carbon fiber, sintered mesh powder, screen mesh, grooved metals with silicon, and/or the like. In an embodiment, the wick layer 130 may be cured at an elevated temperature to increase the porosity of the one or more materials. In one embodiment, the wick layer 130 may select a material based on the coefficient of thermal expansion (CTE) of the material being approximate to the CTE of one or more of the dies 110a-c. In some embodiments, the wick layer 130 may be comprised of one or more differing porous materials (e.g., having different pore sizes and/or different porosity). For example, the wick layer 130 may have one type of wick material with a high liquid transfer rate that may be meshed (or combined) with another type of wick material with a high vapor condensation rate.

Furthermore, as shown in FIG. 1, the vapor chamber 121 may also include a vapor space 131 (or a vapor cavity) defined by the exposed surface of the wick layer 130 and the bottom surface of the lid of the IHS 120, where the vapor space 131 in the vapor chamber 121 may be hermetically sealed/enclosed by the package substrate 102 and the sidewalls and lid of the IHS 120. In these embodiments, the vapor space 131 of the vapor chamber 121 may be partially filled with an evaporating/vaporizing liquid (or a phase-change liquid/fluid) such as water, water-based solutions, ethanol, methanol, acetone, and/or the like, where the liquid may be present in both liquid and gas forms, and be disposed in/on the wick layer 130 and the vapor space 131 of the vapor chamber 121. In some embodiments, the wick layer 130 and the liquid are directly disposed (or deposited) over the surfaces of the dies 110a-c and the package substrate 102 within the vapor chamber 121.

Additionally, in some embodiments, a hydrophobic layer 112 may be directly disposed on the top and side surfaces of the dies 110a-c and the top surface of the package substrate 102. That is, the hydrophobic layer 112 may be disposed (or coated) directly on the electrical components (or active components, organic components, etc.) that may absorb the liquid (e.g., water) and/or may degrade in the presence of the liquid, such as on the surfaces of the dies 110a-c and the package substrate within the vapor chamber 121. In these embodiments, the hydrophobic layer 112 may be positioned between the wick layer 130 and the respective surfaces of the dies 110a-c and the package substrate 102 to implement (or form) a hydrophobic barrier between the vapor chamber 121 and the electrical components within the vapor chamber 121, where such hydrophobic barrier may protect the electrical components from the liquid in the wick layer 130 and/or the vapor space 131 of the vapor chamber 121. In addition, in other embodiments, the hydrophobic layer 112 may be used as an adhesive layer that directly attaches the wick layer 130 over/onto the surfaces of the dies 110a-c and the package substrate 102. In these embodiments, the hydrophobic layer 112 may be comprised of one or more hydrophobic materials such as metals (e.g., a copper-based seed layer (or the like)), polymers, adhesives, and so on. It should be noted that the term "hydrophobic" should not be construed to limit the liquid/fluid used in the vapor chamber 121 to water and/or water-based solutions. Rather, the term "hydrophobic" should be construed as including any material that exerts a repulsion to the liquid/fluid used in the vapor chamber 121 (e.g., for a methanol-based liquid/fluid, the "hydrophobic" layer 112 should be construed as and comprised of a material that repulses methanol).

In some embodiments, the vapor chamber 121 may have the liquid disposed in/on the wick layer 130 and/or the vapor space 131. In these embodiments, the liquid in the vapor chamber 121 may travel through the wick layer 130 (or via the capillary action of the wick layer 130) and be directed up to (or substantially interface with) the hotter surfaces (or regions/portions) of the dies 110a-c, where the liquid in the wick layer 130 may be heated with the heat (or thermal energy) generated by the dies 110a-c and subsequently evaporated through the pores (or porous materials) of the wick layer 130.

Accordingly, in such embodiments, the liquid in the wick layer 130 positioned above the hotter surfaces of the dies 110a-c may be respectively evaporated/converted into an evaporated liquid (or vapor/gas) that may be directed into the vapor space 131 of the vapor chamber 121. The evaporated liquid in the vapor space 131 may thus spread the heat more effectively within the vapor chamber 121 by disposing the evaporated liquid more evenly and quickly through the vapor space 131 from the hotter-side portions (or regions) of the vapor chamber 121 (e.g., the portions of the top surfaces of the dies 110a-c) to the colder-side portions of the vapor chamber 121 (e.g., the portions of the surfaces of the lid and/or sidewalls of the IHS 120). Lastly, in these embodiments, the evaporated liquid in the vapor space 131 may then cool off in the colder-side portions of the vapor chamber 121, condense back into the liquid, and be disposed over/into/onto the surface of the wick layer 130 in the vapor chamber 121, where the liquid may then travel back through the wick layer 130 and up to the hotter surfaces of the dies 110a-c again, completing the circuit.

Note that, in some embodiments, the wick layer 130 may be patterned with one or more different wick structures (or densities) at one or more different locations within the vapor chamber 121 to improve or direct the localized (or cooling) liquid flow of the wick layer 130 based on the desired power and thermal configurations. For example, the wick layer 130 may have one or more surfaces such as tapered surfaces, rounded surfaces, substantially vertical/horizontal/planar surfaces, concave surfaces, and/or the like. For example, the wick layer 130 may have one or more thicknesses based on the one or more thicknesses of the dies 110a-c, the thermal energy of one or more of the dies 110a-c, the desired liquid flow of the wick layer 130, and so on. In one embodiment, the wick layer 130 may have a substantially uniform (or single) thickness, while in another embodiment the wick layer 130 may have one or more different thicknesses. In one embodiment, the wick layer 130 may have a thickness of approximately 100 um or less. In another embodiment, the wick layer 130 may have a thickness of approximately 600 um or less. Also note that, in these embodiments, the semiconductor package 100 may be implemented (or designed) to handle the changing loads on the package substrate 102 based on the design of the vapor chamber 121 (e.g., the volume of the vapor chamber 121, the thickness/width/area/volume of the IHS 120, the thickness of the wick layer 130, etc.).

In an embodiment, a plurality of bridges 150a-b may be disposed in the package substrate 102, and the bridges 150a-b may communicatively couple the dies 110a-c to each other. In an embodiment, the bridges 150a-b may comprise electrical routings 151-152 (or interconnect structures) that may communicatively couple the dies 110a-c to each other. In an embodiment, the bridges 150a-b may be a silicon bridge, a glass bridge, or a bridge made of any other substrate material that is suitable for forming bridges. In some embodiments, the bridges 150a-b may be referred to as an embedded multi-die interconnect bridge (EMIB). For additional embodiments, the bridges 150a-b may include interconnects 151 (e.g., through silicon vias (TSVs) or the like) and bumps 152 (or pads, balls, and/or the like).

According to some embodiments, the semiconductor package 100 is merely one example of an embodiment of a semiconductor packaged system. That is, the semiconductor package 100 is not limited to the illustrated semiconductor packaged system, and thus may be designed/formed with fewer, alternate, or additional packaging components and/or with different interconnecting structures. For example, while one heatsink 122, one TIM 140, one IHS 120, thee dies 110a-c, and one package substrate 102 with two bridges 150a-b are illustrated, it is to be appreciated that the semiconductor package 100 may include and be implemented with (or configured/designed) any number of heatsinks 122, TIMs 140, IHSs 120, dies 110a-c, and package substrates 102 with bridges 150a-b.

For one embodiment, the semiconductor package 100 may include a ball grid array (BGA) package, a land grid array (LGA) package, and/or a pin grid array (PGA) package that may couple the package substrate 102 onto the substrate 101. In some embodiments, one or more of the dies 110a-c, the bridges 150a-b, and/or the package substrate 102 may be coupled via solder balls (or the like) that may be implemented as solder bumps/joints formed from respective microbumps. A solder ball (or joint) formed by soldering of a microbump according to an embodiment may itself be referred to as a "bump" and/or a "microbump." Additionally, for other embodiments, one or more of the dies 110a-c, the bridges 150a-b, and/or the package substrate 102 may be coupled using an anisotropic conductive film (ACF) or the like.

The package substrate 102 and the substrate 101 may include a variety of electronic structures formed thereon or therein. In certain embodiments, the package substrate 102 and the substrate 101 may be an organic substrate made up of one or more layers of polymer base materials or ceramic base materials, with conducting regions for transmitting signals. For some embodiments, the package substrate 102 and/or the substrate 101 may include, but are not limited to, a package, a substrate, a printed circuit board (PCB), and/or a motherboard. In one embodiment, the package substrate 102 is a PCB. In another embodiment, the package substrate 102 is an interposer (or the like) comprised of one or more materials, such as glass, crystal, diamond, low thermal conductive materials, high thermal conductive materials (e.g., gallium nitride (GaN) or the like), silicon, glass-based materials, and/or silicon-based materials (e.g., silicon carbide (SiC) or the like). For one embodiment, the PCB is made of an FR-4 glass epoxy base with thin copper foil laminated on both sides. For certain embodiments, a multi-layer PCB can be used, with pre-preg and copper foil used to make additional layers. For example, the multilayer PCB may include one or more dielectric layers, where the dielectric layers may be a photosensitive dielectric layer. For one embodiment, the PCB may also include one or more conductive layers, which may further include copper (or metallic) traces, lines, pads, vias, holes, and/or planes.

For one embodiment, the dies 110a-c may be comprised, but are not limited to, a semiconductor die, an electronic device (e.g., a wireless device), an integrated circuit (IC), a central processing unit (CPU), a graphic processing unit (GPU), a microprocessor, a platform controller hub (PCH), a memory (e.g., a high bandwidth memory (HBM)), and/or a field-programmable gate array (FPGA). Additionally, in other embodiments, the one or more of the dies 110a-c may be comprised of one or more materials, including glass, crystal, diamond, low thermal conductive materials, high thermal conductive materials (e.g., GaN (or the like)), silicon, glass-based materials, and/or silicon-based materials (e.g., SiC (or the like)). The dies 110a-c may be formed from a material such as silicon and have circuitry thereon that is to be coupled to the package substrate 102 and/or each other. As shown in FIG. 1, although some embodiments are not limited in this regard, the package substrate 102 may in turn be coupled to the substrate 101 (e.g., a computer motherboard, another body, and/or the like) with the solder balls 123. For one embodiment, the dies 110a-c may have one or more different thicknesses (i.e., the dies 110a-c may have three or two different thicknesses). For one embodiment, the dies 110a-c may have a thickness of approximately 100 um to 600 um. Also note that, in some embodiments, the thickness of the wick layer 130 disposed over the die 110a may be substantially equal to or different from the one or more thicknesses of the wick layer 130 that is disposed over the die 110b and/or the die 110c. That is, in these embodiments, the wick layer 130 may have one or more planar surfaces (or top surfaces) that are parallel to each other, and where each of the planar surfaces may have a different z-height. While, in other embodiments, the wick layer 130 may have one or more planar surfaces (or top surfaces) that are parallel and/or coplanar to each other, and where the planar surfaces may have the same and/or different z-heights (e.g. as shown with the wick layers of FIG. 2-6).

One or more connections between the package substrate 102, the dies 110a-c, and the substrate 101 may include one or more interconnect structures and underfill layers if desired. In some embodiments, these interconnect structures (or connections) may variously comprise an alloy of nickel, palladium, and tin (and, in some embodiments, copper). For one embodiment, the underfill layers may be one or more polymer materials that are injected between the respective components. Alternatively, the underfill layers may be molded underfills (MUF) or the like.

In one embodiment, the IHS 120 may be disposed over the wick layer 130, the dies 110a-c, and the package substrate 102. As described above, the IHS 120 may be manufactured (or designed) with one or more desired (or patterned/shaped) configurations such as the lid and the sidewalls of the IHS 120—as long as the one or more desired configurations may be coupled (or integrated) with the package substrate 102 to implement (or form) a hermetically sealed vapor chamber such as the vapor chamber 121. In some embodiments, the IHS 120 may be a heat spreader, a heatsink, a heat exchanger, a manifold, a cold plate, and/or any similar thermal solution (or device) that may be used to help transfer the heat from the electrical components (e.g., the dies 110a-c) of the semiconductor package 100 to the heatsink 122 and/or the ambient environment.

In one embodiment, the IHS 120 may be comprised of one or more highly thermal conductive materials such as copper or the like. Additionally, in some embodiments, by hermetically coupling and sealing the IHS 120 to the package substrate 102 with a soldering process (or the like), the vapor chamber 121 may thus be implemented, sealed, and disposed (or partially filled) with the liquid that may be used to transfer (and/or direct) heat from one location to another location in the wick layer 130 and/or the vapor space 131. Also, in one embodiment, the lid and/or the sidewalls of the IHS 120 may be thinned down to have a low profile (i.e., the thickness of the lid of the IHS 120 may be reduced to a thinner lid) based on most of the heat spreading coming from the vapor chamber 121 instead of the IHS 120.

Furthermore, in some embodiments, the TIM 140 may be disposed and coupled on the IHS 120, where the TIM 140 may be positioned (or sandwiched) between the top surface of the IHS 120 and the bottom surface of the heatsink 122. In one embodiment, the TIM 140 may be a solder TIM (STIM) such as an indium STIM or the like. In other embodiments, the TIM 140 may include one or more highly thermal conductivity materials such as a metallic TIM, a STIM, a polymer TIM (PTIM), and/or any similar highly thermal conductive material(s).

In one embodiment, the heatsink 122 may be disposed over the TIM 140, the IHS 120, and the package substrate 102, where the heatsink 122 may be directly disposed on the TIM 140. In some embodiments, the heatsink 122 may be a heatsink with fins, a heat exchanger, a manifold, a cold plate, and/or any similar thermal solution (or device) that may be used to help transfer the heat from the electrical components of the semiconductor package 100 to the ambient environment (or an additional heat spreader).

Note that the semiconductor package 100 may include fewer or additional packaging components based on the desired packaging design.

Figure 2:
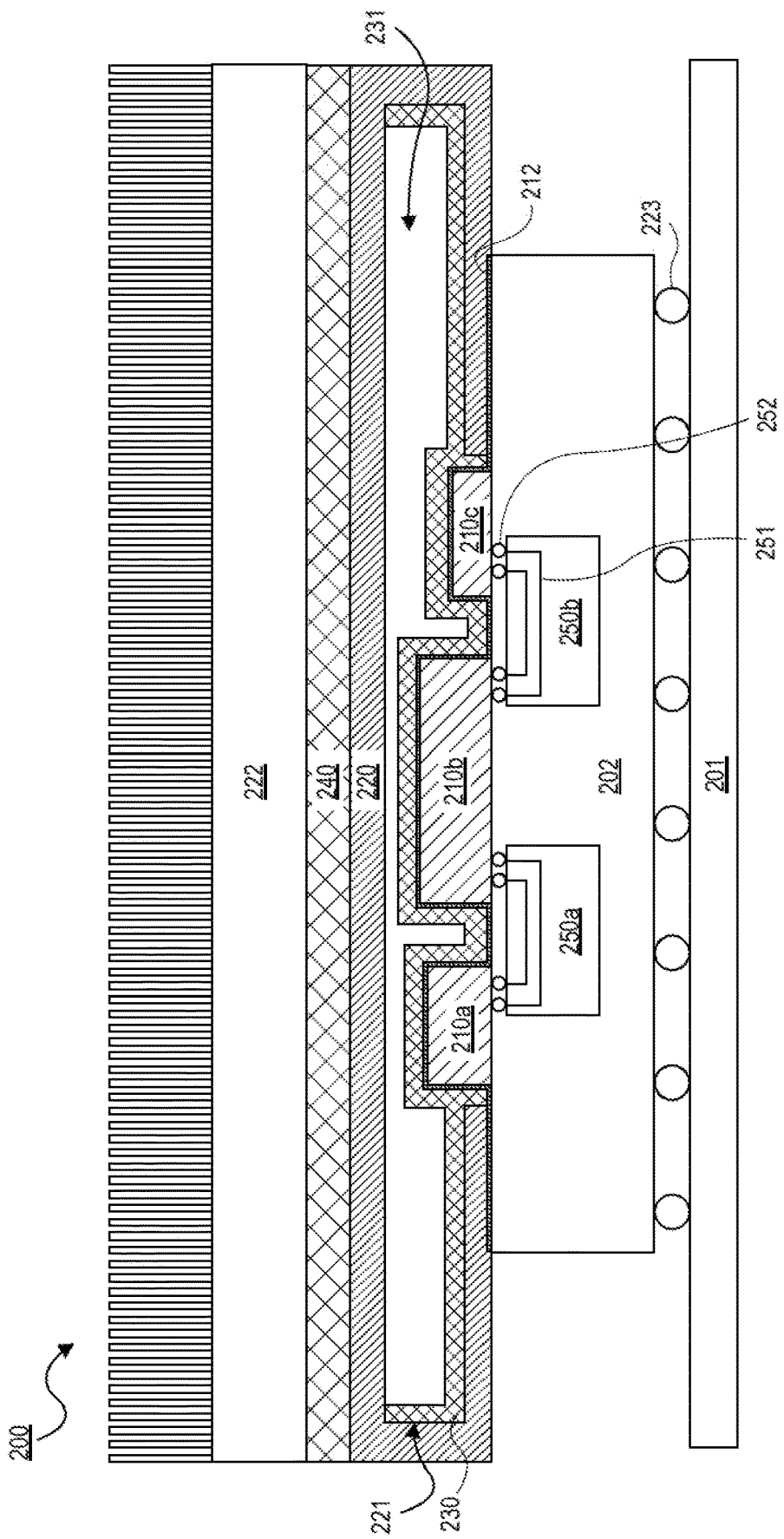
FIG. 2 is an illustration of a cross-sectional view of a semiconductor package with an enlarged heatsink, a TIM, an enlarged IHS, a vapor chamber, a wick layer, a plurality of dies, a package substrate, and a substrate, according to one embodiment.

Referring now to FIG. 2, a cross-sectional illustration of a semiconductor package 200 is shown, in accordance with an embodiment. For some embodiments, the semiconductor package 200 may be substantially similar to the semiconductor package 100 described above in FIG. 1, with the exceptions that the widths of the respective IHS 220, the TIM 240, and the heatsink 222 cover, extend over, and are substantially greater than the width of the surface (or top surface) of the package substrate 202, and that the IHS 220 has a surface (or an L-shaped sidewall) which extends vertically and is disposed over/on the surface of the package substrate 202 and parallel to the lid of the IHS 220. As such, in these embodiments, the semiconductor package 200 may be substantially similar to the semiconductor package 100 described above in FIG. 1, with the additional exceptions that the IHS 220 is patterned with the extended lid and the L-shaped sidewalls, that the IHS 220 and the vapor chamber 221 have a width greater than a width of the IHS 120 and the vapor chamber 121 of FIG. 1, and that the IHS 220 has a thickness (or z-height) lower than a thickness of the IHS 120 of FIG. 1.

Likewise, the components of the semiconductor package 200 may be substantially similar to the components of the semiconductor package 100 described above in FIG. 1. For example, the vapor chamber 221 may be substantially similar to the vapor chamber 121 described above in FIG. 1, with the exceptions that the vapor chamber 221 is hermetically defined by the top surface of the package substrate 202 and the interior surfaces of the extended lid and the L-shaped sidewalls of the IHS 220, and that the width and thickness of the vapor chamber 221 are greater than the width and thickness of the vapor chamber 121 of FIG. 1. Accordingly, the heatsink 222, the TIM 240, the IHS 220, the wick layer 230, the hydrophobic layer 212, the vapor space 231, the dies 210a-c, the package substrate 202, the bridges 250a-b with the electrical routings 251-252, the solder balls 223, and the substrate 201 may be substantially similar to the heatsink 122, the TIM 140, the IHS 120, the wick layer 130, the hydrophobic layer 112, the vapor space 131, the dies 110a-c, the package substrate 102, the bridges 150a-b with the electrical routings 151-152, the solder balls 123, and the substrate 101 described above in FIG. 1.

As shown in FIG. 2, in some embodiments, the heatsink 222, the TIM 240, and the IHS 220 may have substantially equal widths to each other. While, in other embodiments, one or more of the heatsink 222, the TIM 240, and the IHS 220 may have different widths from each other. Also, in these embodiments, the IHS 220 may be patterned with the extended lid and the L-shaped sidewalls, where the L-shaped sidewalls has portions that extend horizontally over/on the top surface of the package substrate 202. For example, whereas the sidewalls of the IHS 120 of FIG. 1 are only patterned to extend vertically over/on the top surface of the package substrate 102, the sidewalls of the IHS 220 of FIG. 2 may have a first portion (or the larger, horizontal portion) that extends horizontally over/on the top surface of the package substrate 202 and a second portion (or the shorter, vertical portion) that extends vertically over the top surface of the substrate 201.

Note that the semiconductor package 200 may include fewer or additional packaging components based on the desired packaging design.

Figure 3:
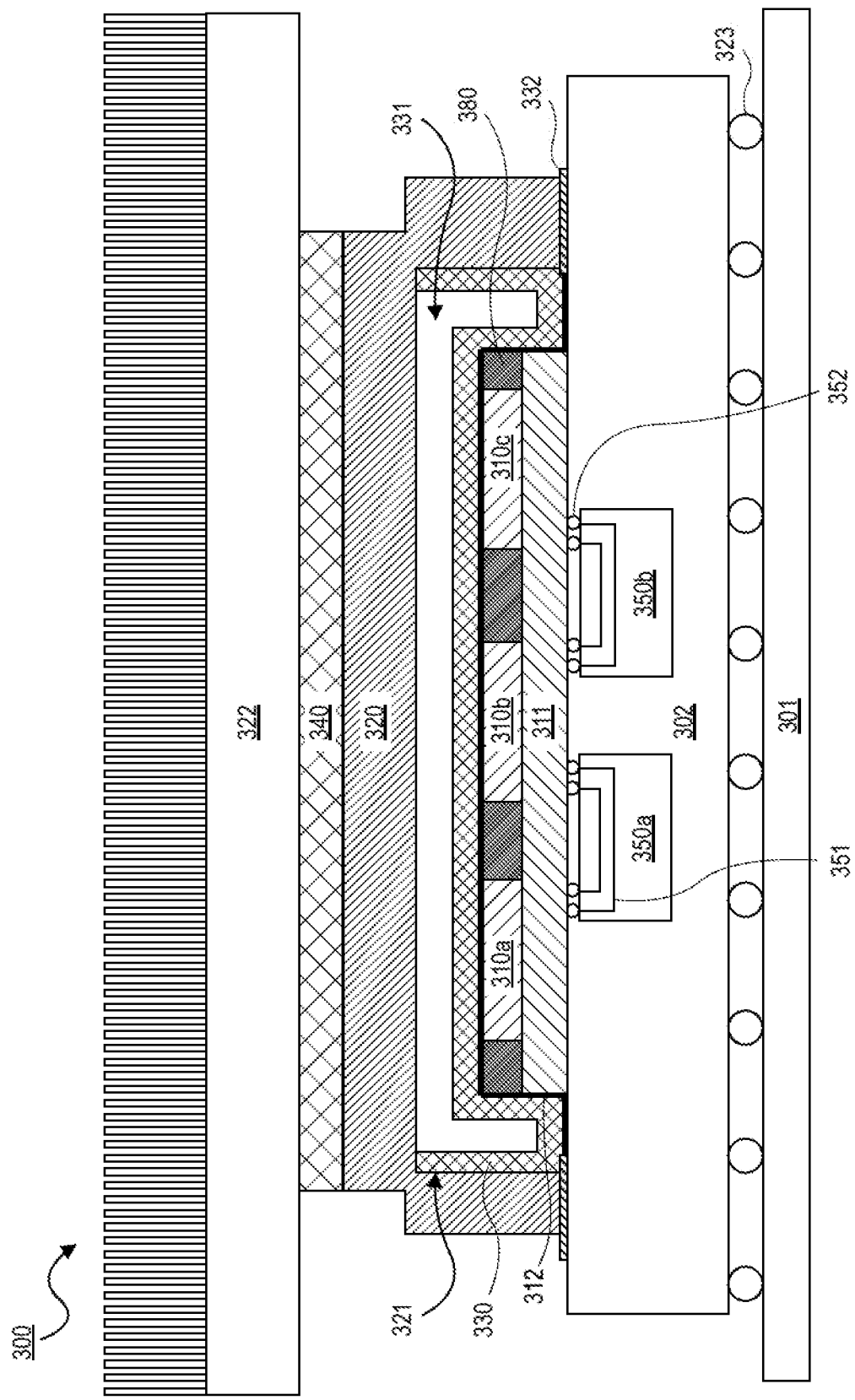
FIG. 3 is an illustration of a cross-sectional view of a semiconductor package with a heatsink, a TIM, an IHS, a vapor chamber, a wick layer, an encapsulation layer, a plurality of top dies, a bottom die, a package substrate, and a substrate, according to one embodiment.

Referring now to FIG. 3, a cross-sectional illustration of a semiconductor package 300 is shown, in accordance with an embodiment. For some embodiments, the semiconductor package 300 may be substantially similar to the semiconductor package 100 described above in FIG. 1, with the exceptions that the dies 310a-c (or the top dies 310a-c) are stacked on the die 311 (or the bottom die 311), that the stack of top dies 310a-c and bottom die 311 are disposed on the package substrate 302, and that an encapsulation layer 380 is disposed directly on the die 311 and also surrounds the top dies 310a-c. As such, in these embodiments, the semiconductor package 300 may be substantially similar to the semiconductor package 100 described above in FIG. 1, with the additional exceptions that the wick layer 330 is only disposed on the side surfaces (or the outer sidewalls) of the bottom die 311, and that the wick layer 330 is only disposed on the top surfaces of the top dies 310a-c. Whereas, the wick layer 130 of FIG. 1 fully surrounds the side and top surfaces of the dies 110a-c, the wick layer 330 of FIG. 3 only surrounds the side surfaces of the bottom die 311 and only surrounds the top surfaces of the top dies 310a-c.

Likewise, the components of the semiconductor package 300 may be substantially similar to the components of the semiconductor package 100 described above in FIG. 1. Accordingly, the heatsink 322, the TIM 340, the IHS 320, the sealant 332, the vapor chamber 321, the wick layer 330, the hydrophobic layer 312, the vapor space 331, the top and bottom dies 310a-c and 311, the package substrate 302, the bridges 350a-b with the electrical routings 351-352, the solder balls 323, and the substrate 301 may be substantially similar to the heatsink 122, the TIM 140, the IHS 120, the sealant 132, the vapor chamber 121, the wick layer 130, the hydrophobic layer 112, the vapor space 131, the dies 110a-c, the package substrate 102, the bridges 150a-b with the electrical routings 151-152, the solder balls 123, and the substrate 101 described above in FIG. 1.

As shown in FIG. 3, in some embodiments, the encapsulation layer 380 may be disposed in between the top dies 310a-c, where the encapsulation layer 380 may be disposed between the top surface of the bottom die 311 and the bottom surface of the wick layer 330. For one embodiment, the encapsulation layer 380 may be planarized as the top surface of the encapsulation layer 380 may be substantially coplanar to the top surfaces of the top dies 310a-c. In one embodiment, the encapsulation layer 380 may fully surround the side surfaces of the top dies 310a-c. Note that, in alternate embodiments, the encapsulation layer 380 may be implemented to partially or fully surround the bottom die 311. In some embodiments, the encapsulation layer 380 may include one or more encapsulation materials such as a mold material, an underfill material, a filler material, any similar materials, and/or any combination thereof.

Note that the semiconductor package 300 may include fewer or additional packaging components based on the desired packaging design.

Figure 4:
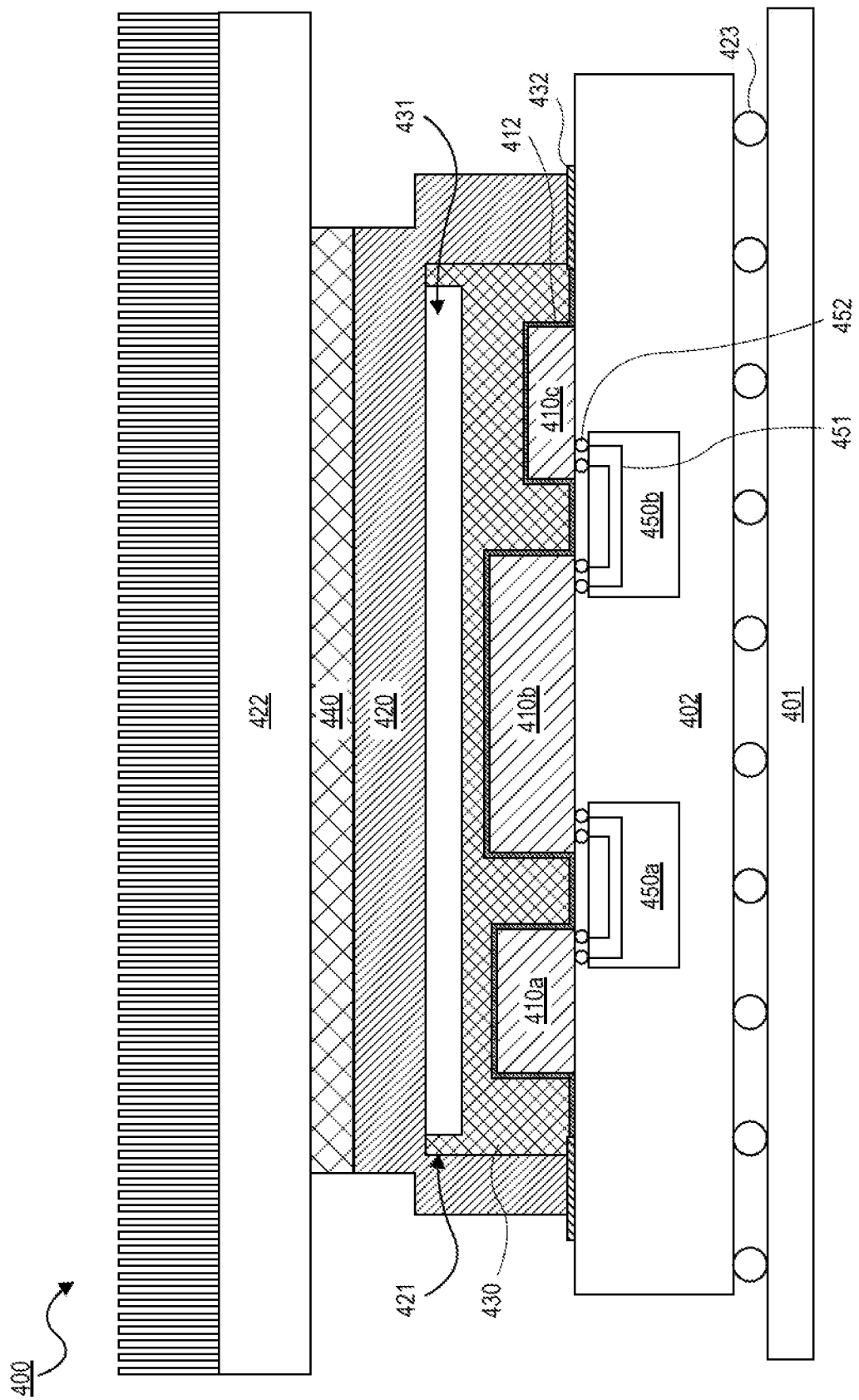
FIG. 4 is an illustration of a cross-sectional view of a semiconductor package with a heatsink, a TIM, an IHS, a vapor chamber, a wick layer, a plurality of dies, a package substrate, and a substrate, according to one embodiment.

Referring now to FIG. 4, a cross-sectional illustration of a semiconductor package 400 is shown, in accordance with an embodiment. For some embodiments, the semiconductor package 400 may be substantially similar to the semiconductor package 100 described above in FIG. 1, with the exceptions that the wick layer 430 has a portion with a thickness that is greater than any of the thicknesses of the dies 410a-c, that the portion of the wick layer 430 has a top surface that is parallel to each of the top surfaces of the dies 410a-c and the package substrate 402, and that, as a result, the vapor space 431 has a thickness (or volume) lower than the thickness of the vapor space 131 of FIG. 1. Whereas, the wick layer 130 of FIG. 1 has a thickness that is substantially the same all throughout (i.e., the wick layer 130 may be a layer with a uniform thickness), the wick layer 430 of FIG. 4 may have different thicknesses and one portion with a thickness (or z-height) that is greater than each of the thicknesses of the dies 410a-c.

Likewise, the components of the semiconductor package 400 may be substantially similar to the components of the semiconductor package 100 described above in FIG. 1. Accordingly, the heatsink 422, the TIM 440, the IHS 420, the sealant 432, the vapor chamber 421, the wick layer 430, the hydrophobic layer 412, the vapor space 431, the dies 410a-c, the package substrate 402, the bridges 450a-b with the electrical routings 451-452, the solder balls 423, and the substrate 401 may be substantially similar to the heatsink 122, the TIM 140, the IHS 120, the sealant 132, the vapor chamber 121, the wick layer 130, the hydrophobic layer 112, the vapor space 131, the dies 110a-c, the package substrate 102, the bridges 150a-b with the electrical routings 151-152, the solder balls 123, and the substrate 101 described above in FIG. 1.

Note that the semiconductor package 400 may include fewer or additional packaging components based on the desired packaging design.

Figure 5:
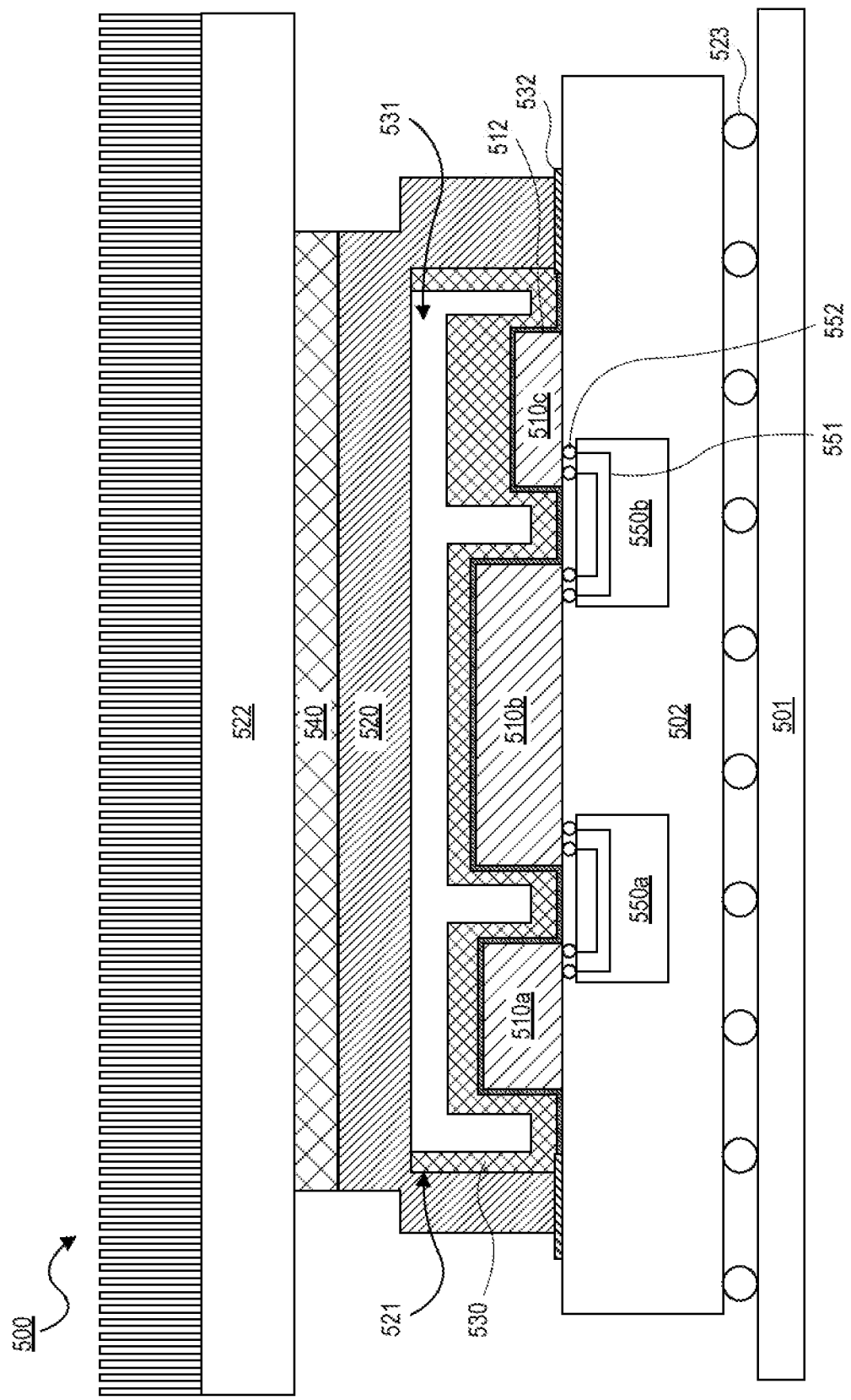
FIG. 5 is an illustration of a cross-sectional view of a semiconductor package with a heatsink, a TIM, an IHS, a vapor chamber, a wick layer, a plurality of dies, a package substrate, and a substrate, according to one embodiment.

Referring now to FIG. 5, a cross-sectional illustration of a semiconductor package 500 is shown, in accordance with an embodiment. For some embodiments, the semiconductor package 500 may be substantially similar to the semiconductor package 100 described above in FIG. 1, with the exceptions that the wick layer 530 has different thicknesses directly above/over the top surfaces of the dies 510a-c, and that the wick layer 530 has one or more surfaces directly above/over the top surfaces of the dies 510a-c that are substantially coplanar to each other. Whereas, the wick layer 130 of FIG. 1 has a thickness that is substantially the same above each of the top surfaces of the dies 110a-c (i.e., the wick layer 130 has surfaces substantially parallel to and above/below each other, but are not coplanar), the wick layer 530 of FIG. 5 may have different thicknesses directly above/over the top surfaces of the dies 510a-c (i.e., the thickness of the wick layer 530 above the top surface of the dies 510c is greater than the thicknesses of the wick layer 530 that are above the top surfaces of the dies 510a-b, and so on), while the wick layer 530 may maintain surfaces (or the top surfaces above the dies 510a-c) that are substantially coplanar to each other.

Likewise, the components of the semiconductor package 500 may be substantially similar to the components of the semiconductor package 100 described above in FIG. 1. Accordingly, the heatsink 522, the TIM 540, the IHS 520, the sealant 532, the vapor chamber 521, the wick layer 530, the hydrophobic layer 512, the vapor space 531, the dies 510a-c, the package substrate 502, the bridges 550a-b with the electrical routings 551-552, the solder balls 523, and the substrate 501 may be substantially similar to the heatsink 122, the TIM 140, the IHS 120, the sealant 132, the vapor chamber 121, the wick layer 130, the hydrophobic layer 112, the vapor space 131, the dies 110a-c, the package substrate 102, the bridges 150a-b with the electrical routings 151-152, the solder balls 123, and the substrate 101 described above in FIG. 1.

Note that the semiconductor package 500 may include fewer or additional packaging components based on the desired packaging design.

Figure 6:
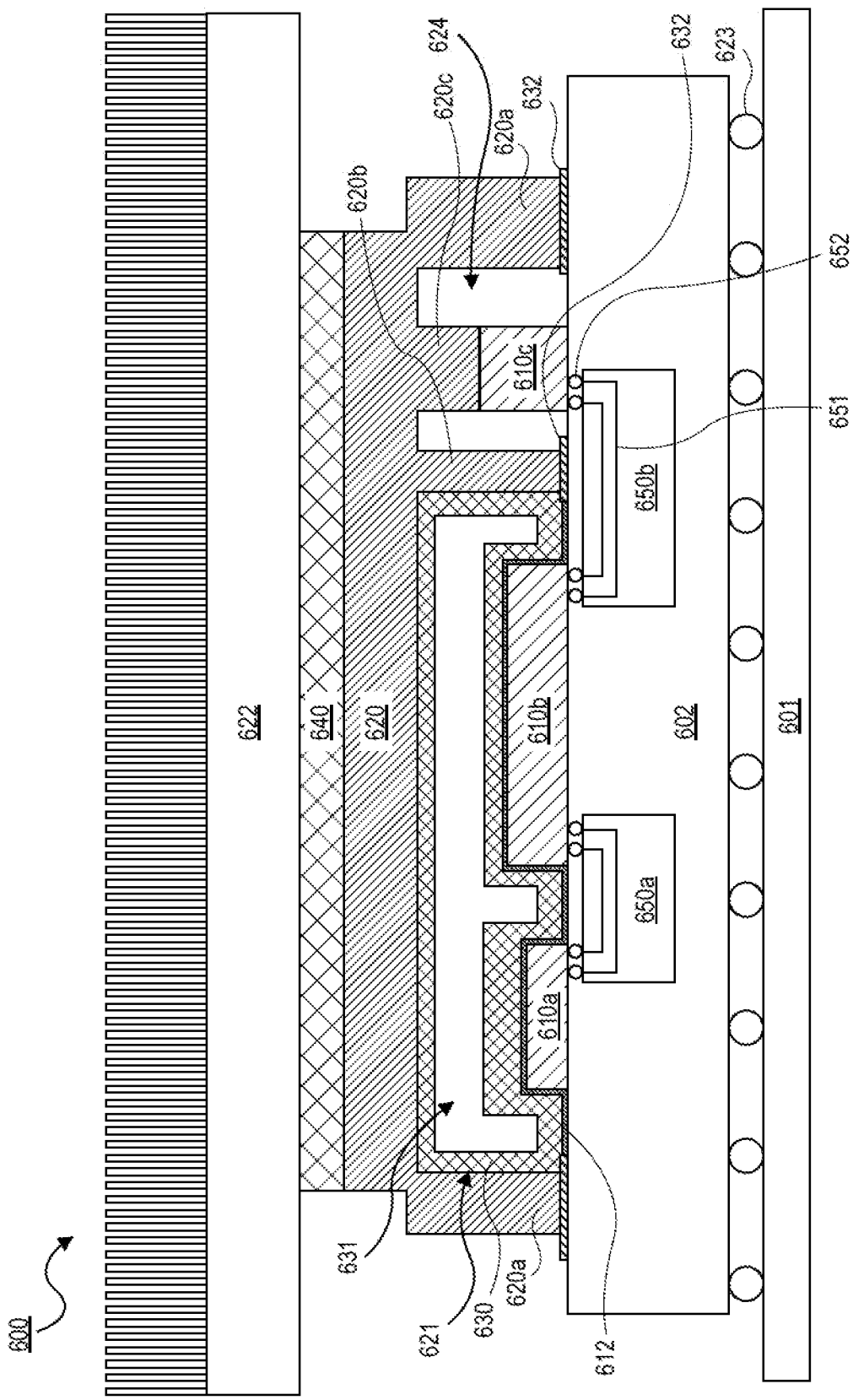
FIG. 6 is an illustration of a cross-sectional view of a semiconductor package with a heatsink, a TIM, an IHS with one or more pedestals, a vapor chamber, a wick layer, a plurality of dies, a package substrate, and a substrate, according to one embodiment.

Referring now to FIG. 6, a cross-sectional illustration of a semiconductor package 600 is shown, in accordance with an embodiment. For some embodiments, the semiconductor package 600 may be similar to the semiconductor package 100 described above in FIG. 1, with the exceptions that the IHS 620 has one or more pedestals 620b-c, and that the pedestals 620b-c of the IHS 620 enable defining the vapor chamber 621 and the cavity 624. Whereas, the IHS 120 of FIG. 1 only defines (or encloses) the vapor chamber 121 that surrounds the dies 110a-c, the IHS 620 of FIG. 6 hermetically defines the vapor chamber 621 that surrounds the dies 610a-b, and defines the cavity 624 that surrounds the die 610c.

Likewise, the components of the semiconductor package 600 may be substantially similar to the components of the semiconductor package 100 described above in FIG. 1. Accordingly, the heatsink 622, the TIM 640, the IHS 620, the sealant 632, the vapor chamber 621, the wick layer 630, the hydrophobic layer 612, the vapor space 631, the dies 610a-c, the package substrate 602, the bridges 650a-b with the electrical routings 651-652, the solder balls 623, and the substrate 601 may be substantially similar to the heatsink 122, the TIM 140, the IHS 120, the sealant 132, the vapor chamber 121, the wick layer 130, the hydrophobic layer 112, the vapor space 131, the dies 110a-c, the package substrate 102, the bridges 150a-b with the electrical routings 151-152, the solder balls 123, and the substrate 101 described above in FIG. 1.

As shown in FIG. 6, in some embodiments, the vapor chamber 621 may be hermetically sealed and defined by the top surface of the package substrate 602, and the lid, the sidewalls 620a, and the pedestal 620b. Also, as shown in FIG. 6, for some embodiments, the wick layer 630 may be disposed on one or more surfaces of the lid, the sidewalls 620a, and the pedestal 620b of the IHS 620. In additional embodiments, the pedestal 620c of the IHS 620 may be disposed directly on the top surface of the die 610c to help direct (or transfer) the heat generated by the die 610c to the lid of the IHS 620. In other embodiments, the pedestal 620c may be omitted as such a TIM (or the like) may be disposed between the top surface of the die 610c and the bottom surface of the lid of the IHS 620. Note that, in some embodiments, the IHS 620 and/or the vapor chamber 621 and the cavity 624 defined by the IHS 620 may be patterned and shaped with several different configurations based on the desired packaging and thermal design. Also note that, even if two dies 610a-b are shown to be positioned within the vapor chamber 621, and one die 610c is shown to be positioned within the cavity 624, one or more dies 610a-c may be positioned within the vapor chamber 621 and/or the cavity 624. In these embodiments, the cavity 624 may be filled with air (or the like) that may surround the side surfaces of the die 610c.

Note that the semiconductor package 600 may include fewer or additional packaging components based on the desired packaging design.

Figure 7:
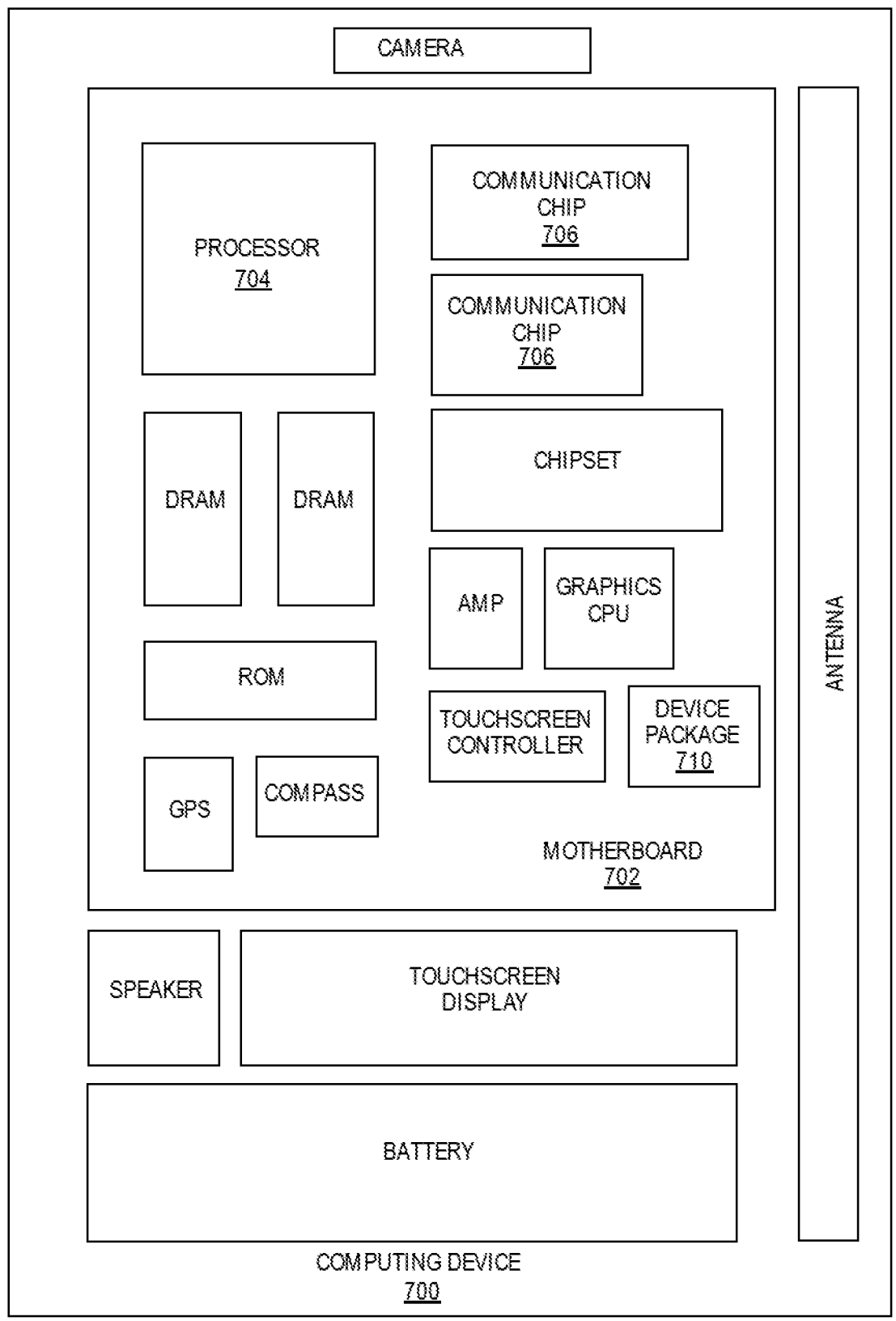
FIG. 7 is an illustration of a schematic block diagram illustrating a computer system that utilizes a semiconductor package with a heatsink, a TIM, an IHS, a vapor chamber, a wick layer, an encapsulation layer, a plurality of dies, a base die, a package substrate, and a substrate, according to one embodiment.

FIG. 7 is an illustration of a schematic block diagram illustrating a computer system 700 that utilizes a device package 710 (or a semiconductor package) with a heatsink, a TIM, an IHS, a vapor chamber, a wick layer, an encapsulation layer, a plurality of dies, a package substrate, according to one embodiment. FIG. 7 illustrates an example of computing device 700. Computing device 700 houses a motherboard 702. Motherboard 702 may include a number of components, including but not limited to processor 704, device package 710 (or semiconductor package), and at least one communication chip 703. Processor 704 is physically and electrically coupled to motherboard 702. For some embodiments, at least one communication chip 706 is also physically and electrically coupled to motherboard 702. For other embodiments, at least one communication chip 706 is part of processor 704.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 706 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 706 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

Processor 704 of computing device 700 includes an integrated circuit die packaged within processor 704. Device package 710 may be a semiconductor package that may include, but is not limited to, a substrate, a package substrate, and/or a PCB. In one embodiment, device package 710 may be substantially similar to the semiconductor packages of FIGS. 1-6 described herein. Device package 710 may include the hermetically sealed vapor chamber defined by the surfaces of the IHS and the package substrate as described herein (e.g., as illustrated and described above with the vapor chamber of FIGS. 1-6)—or any other components from the figures described herein.

Note that device package 710 may be a single component/device, a subset of components, and/or an entire system, as the materials, features, and components may be limited to device package 710 and/or any other component of the computing device 700 that may need the vapor chambers as described herein (e.g., the motherboard 702, the processor 704, and/or any other component of the computing device 700 that may need the embodiments of the vapor chambers and/or the semiconductor packages described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 706 also includes an integrated circuit die packaged within the communication chip 706. For some embodiments, the integrated circuit die of the communication chip 706 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a die on a package substrate; an integrated heat spreader (IHS) over the die and the package substrate, wherein the IHS has a lid and a plurality of sidewalls; a sealant that couples the plurality of sidewalls of the IHS to the package substrate; and a layer below the lid of the IHS, wherein the layer is over the die and a top surface of the package substrate, and wherein the layer is on a bottom surface of the lid of the IHS and an interior surface of the plurality of sidewalls of the IHS.

In example 2, the subject matter of example 1 can optionally include a vapor chamber is defined by the top surface of the package substrate, the bottom surface of the lid of the IHS, and the interior surface of the plurality of sidewalls of the IHS, wherein the vapor chamber is hermetically sealed with the sealant between the top surface of the package substrate and the plurality of sidewalls of the IHS, and wherein the vapor chamber has a vapor space defined by a surface of the layer and the bottom surface of the lid of the IHS.

In example 3, the subject matter of examples 1-2 can optionally include that the layer is over a surface of the die, wherein the layer is comprised of one or more wick materials, wherein the one or more wick materials include one or more porous materials, and wherein the one or more porous materials include metals, powders, or graphite.

In example 4, the subject matter of examples 1-3 can optionally include that the bottom surface of the lid of the IHS faces the top surface of the package substrate and the surface of the die, and wherein the interior surface of the plurality of sidewalls of the IHS faces the surface of the die.

In example 5, the subject matter of examples 1-4 can optionally include the layer thermally couples the surface of the die to the bottom surface of the lid of the IHS.

In example 6, the subject matter of examples 1-5 can optionally include that a hydrophobic layer on the surface of the die and the top surface of the package substrate, wherein the hydrophobic layer is between the layer and the surface of the die, and wherein the hydrophobic layer is between the layer and the top surface of the package substrate; a liquid in the vapor chamber, wherein a portion of the liquid is in the layer; a thermal interface material (TIM) on the IHS; a heatsink on the TIM, wherein the TIM is positioned between the IHS and the heatsink; a bridge in the package substrate, wherein the bridge communicatively couples the die and the package substrate; and a plurality of solder balls couple the package substrate to a substrate.

In example 7, the subject matter of examples 1-6 can optionally include that the layer has a uniform thickness.

In example 8, the subject matter of examples 1-7 can optionally include that the liquid is comprised of water, water-based solutions, ethanol, methanol, or acetone.

In example 9, the subject matter of examples 1-8 can optionally include a region of the surface of the layer has a vertical sidewall or a tapered sidewall.

Example 10 is a semiconductor package, comprising: a package substrate on a substrate; a plurality of dies on the package substrate; an integrated heat spreader (IHS) over the plurality of dies, the package substrate, and the substrate, wherein the IHS has a lid and a plurality of L-shaped sidewalls, and wherein the IHS has a width that is greater than a width of the package substrate; a sealant that couples the plurality of L-shaped sidewalls of the IHS to the package substrate; and a layer below the lid of the IHS, wherein the layer is over the plurality of dies and a top surface of the package substrate, and wherein the layer is on a bottom surface of the lid of the IHS and an interior surface of the plurality of L-shaped sidewalls of the IHS.

In example 11, the subject matter of example 10 can optionally include a vapor chamber is defined by the top surface of the package substrate, the bottom surface of the lid of the IHS, and the interior surface of the plurality of L-shaped sidewalls of the IHS, wherein the vapor chamber is hermetically sealed with the sealant between the top surface of the package substrate and the plurality of L-shaped sidewalls of the IHS, and wherein the vapor chamber has a vapor space defined by a surface of the layer and the bottom surface of the lid of the IHS.

In example 12, the subject matter of examples 10-11 can optionally include that the IHS is a low profile IHS, wherein the low profile IHS has a thickness slightly greater than a thickness of the plurality of dies, wherein the layer is over a plurality of surfaces of the plurality of dies, wherein the layer is comprised of one or more wick materials, wherein the one or more wick materials include one or more porous materials, and wherein the one or more porous materials include metals, powders, or graphite.

In example 13, the subject matter of examples 10-12 can optionally include that the layer thermally couples the plurality of surfaces of the plurality of dies to the bottom surface of the lid of the IHS, wherein the bottom surface of the lid of the IHS faces the top surface of the package substrate and the plurality of surfaces of the plurality of dies, wherein the interior surface of the plurality of L-shaped sidewalls of the IHS faces the plurality of surfaces of the plurality of dies, wherein the plurality of L-shaped sidewalls of the IHS have a first portion and a second portion, wherein the first portion of the plurality of L-shaped sidewalls of the IHS extends horizontally over the top surface of the package substrate and a top surface of the substrate, wherein the second portion of the plurality of L-shaped sidewalls of the IHS extends vertically over the top surface of the substrate, and wherein the first portion of the plurality of L-shaped sidewalls of the IHS has a footprint greater than a footprint of the second portion of the plurality of L-shaped sidewalls of the IHS.

In example 14, the subject matter of examples 10-13 can optionally include a hydrophobic layer on the plurality of surfaces of the plurality of dies and the top surface of the package substrate, wherein the hydrophobic layer is between the layer and the plurality of surfaces of the plurality of dies, wherein the hydrophobic layer is between the layer and the top surface of the package substrate, and wherein the hydrophobic layer is between the top surface of the package substrate and an exterior surface of the plurality of L-shaped sidewalls of the IHS; a liquid in the vapor chamber, wherein a portion of the liquid is in the layer; a thermal interface material (TIM) on the IHS; a heatsink on the TIM, wherein the TIM is positioned between the IHS and the heatsink; a plurality of bridges in the package substrate, wherein the plurality of bridges communicatively couple the plurality of dies to each other; and a plurality of solder balls couple the package substrate to the substrate.

In example 15, the subject matter of examples 10-14 can optionally include that the plurality of dies include a first die with a first thickness, and a second die with a second thickness, wherein the first thickness of the first die is different from the second thickness of the second die, and wherein the layer has a substantially uniform thickness or a non-uniform thickness.

In example 16, the subject matter of examples 10-15 can optionally include that the vapor chamber has a width greater than the width of the package substrate.

In example 17, the subject matter of examples 10-16 can optionally include that the liquid is comprised of water, water-based solutions, ethanol, methanol, or acetone, and wherein a region of the surface of the layer has a vertical sidewall or a tapered sidewall.

In example 18, the subject matter of examples 10-17 can optionally include that the first die has a first top surface, and the second die has a second top surface, wherein the layer has a first top surface positioned directly over the first top surface of the first die, wherein the layer has a second top surface positioned directly over the second top surface of the second die, wherein the first top surface of the layer is parallel to or coplanar to the second top surface of the layer, wherein the layer has a first thickness defined from the first top surface of the first die to the first top surface of the layer, wherein the layer has a second thickness defined from the second top surface of the second die to the second top surface of the layer, and wherein the first thickness of the layer is equal to or different from the second thickness of the layer.

Example 19 is a semiconductor package, comprising: a package substrate on a substrate; a bottom die on the package substrate; a plurality of top dies on the bottom die; an encapsulation layer on the bottom die, wherein the encapsulation layer surrounds the plurality of top dies; a layer over the encapsulation layer, the plurality of top dies, the bottom die, and a top surface of the package substrate; an integrated heat spreader (IHS) over the layer, wherein the IHS has a lid and a plurality of sidewalls; and a sealant that couples the plurality of sidewalls of the IHS to the package substrate, wherein the layer is on a bottom surface of the lid of the IHS and an interior surface of the plurality of sidewalls of the IHS.

In example 20, the subject matter of example 19 can optionally include a vapor chamber is defined by the top surface of the package substrate, the bottom surface of the lid of the IHS, and the interior surface of the plurality of sidewalls of the IHS, wherein the vapor chamber is hermetically sealed with the sealant between the top surface of the package substrate and the plurality of sidewalls of the IHS, wherein the vapor chamber has a vapor space defined by a surface of the layer and the bottom surface of the lid of the IHS, wherein the layer is over a surface of the plurality of top dies and a surface of the bottom die, wherein the layer is comprised of one or more wick materials, wherein the one or more wick materials include one or more porous materials, and wherein the one or more porous materials include metals, powders, or graphite.

In example 21, the subject matter of examples 19-20 can optionally include that the layer thermally couples the surfaces of the plurality of top dies and the bottom die to the bottom surface of the lid of the IHS, wherein the bottom surface of the lid of the IHS faces the top surface of the package substrate and the plurality of surfaces of the plurality of dies, and wherein the interior surface of the plurality of sidewalls of the IHS faces the surface of the bottom die.

In example 22, the subject matter of examples 19-21 can optionally include that a hydrophobic layer on the surfaces of the plurality of top dies and the bottom die, a surface of the encapsulation layer, and the top surface of the package substrate, wherein the hydrophobic layer is between the layer and the surfaces of the plurality of top dies and the bottom die, wherein the hydrophobic layer is between the layer and the top surface of the package substrate, and wherein the hydrophobic layer is between the layer and the surface of the encapsulation layer; a liquid in the vapor chamber, wherein a portion of the liquid is in the layer; a thermal interface material (TIM) on the IHS; a heatsink on the TIM, wherein the TIM is positioned between the IHS and the heatsink; a plurality of bridges in the package substrate, wherein the plurality of bridges communicatively couple the bottom die to the plurality of top dies; and a plurality of solder balls couple the package substrate to the substrate.

In example 23, the subject matter of examples 19-22 can optionally include that the layer has a uniform thickness or a non-uniform thickness.

In example 24, the subject matter of examples 19-23 can optionally include that the liquid is comprised of water, water-based solutions, ethanol, methanol, or acetone, and wherein a region of the surface of the layer has a vertical sidewall or a tapered sidewall.

In example 25, the subject matter of examples 19-24 can optionally include that the plurality of top dies have the same thickness, and wherein the surface of the encapsulation layer is coplanar to the surface of the plurality of top dies.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
a die on a package substrate;
an integrated heat spreader (IHS) over the die and the package substrate, wherein the IHS has a lid and a plurality of sidewalls;
a sealant that couples the plurality of sidewalls of the IHS to the package substrate; and
a layer below the lid of the IHS, wherein the layer is over the die and a top surface of the package substrate, and wherein the layer is on a bottom surface of the lid of the IHS and an interior surface of the plurality of sidewalls of the IHS, wherein a vapor chamber is defined by the top surface of the package substrate, the bottom surface of the lid of the IHS, and the interior surface of the plurality of sidewalls of the IHS, and wherein the bottom surface of the lid of the IHS is exposed to the vapor chamber.

2. The semiconductor package of claim 1, wherein the vapor chamber is hermetically sealed with the sealant between the top surface of the package substrate and the plurality of sidewalls of the IHS, and wherein the vapor chamber has a vapor space defined by a surface of the layer and the bottom surface of the lid of the IHS.

3. The semiconductor package of claim 2, wherein the layer is over a surface of the die, wherein the layer is comprised of one or more wick materials, wherein the one or more wick materials include one or more porous materials, and wherein the one or more porous materials include metals, powders, or graphite.

4. The semiconductor package of claim 3, wherein the bottom surface of the lid of the IHS faces the top surface of the package substrate and the surface of the die, and wherein the interior surface of the plurality of sidewalls of the IHS faces the surface of the die.

5. The semiconductor package of claim 3, wherein the layer thermally couples the surface of the die to the bottom surface of the lid of the IHS.

6. The semiconductor package of claim 3, further comprising:
  a hydrophobic layer on the surface of the die and the top surface of the package substrate, wherein the hydrophobic layer is between the layer and the surface of the die, and wherein the hydrophobic layer is between the layer and the top surface of the package substrate;
  a liquid in the vapor chamber, wherein a portion of the liquid is in the layer;
  a thermal interface material (TIM) on the IHS;
  a heatsink on the TIM, wherein the TIM is positioned between the IHS and the heatsink;
  a bridge in the package substrate, wherein the bridge communicatively couples the die and the package substrate; and
  a plurality of solder balls couple the package substrate to a substrate.

7. The semiconductor package of claim 1, wherein the layer has a uniform thickness.

8. The semiconductor package of claim 6, wherein the liquid is comprised of water, water-based solutions, ethanol, methanol, or acetone.

9. The semiconductor package of claim 2, wherein a region of the surface of the layer has a vertical sidewall or a tapered sidewall.

10. A semiconductor package, comprising:
  a package substrate on a substrate;
  a plurality of dies on the package substrate;
  an integrated heat spreader (IHS) over the plurality of dies, the package substrate, and the substrate, wherein the IHS has a lid and a plurality of L-shaped sidewalls, and wherein the IHS has a width that is greater than a width of the package substrate;
  a sealant that couples the plurality of L-shaped sidewalls of the IHS to the package substrate; and
  a layer below the lid of the IHS, wherein the layer is over the plurality of dies and a top surface of the package substrate, and wherein the layer is on a bottom surface of the lid of the IHS and an interior surface of the plurality of L-shaped sidewalls of the IHS, wherein a vapor chamber is defined by the top surface of the package substrate, the bottom surface of the lid of the IHS, and the interior surface of the plurality of L-shaped sidewalls of the IHS, and wherein the bottom surface of the lid of the IHS is exposed to the vapor chamber.

11. The semiconductor package of claim 10, wherein the vapor chamber is hermetically sealed with the sealant between the top surface of the package substrate and the plurality of L-shaped sidewalls of the IHS, and wherein the vapor chamber has a vapor space defined by a surface of the layer and the bottom surface of the lid of the IHS.

12. The semiconductor package of claim 11, wherein the IHS is a low profile IHS, wherein the low profile IHS has a thickness slightly greater than a thickness of the plurality of dies, wherein the layer is over a plurality of surfaces of the plurality of dies, wherein the layer is comprised of one or more wick materials, wherein the one or more wick materials include one or more porous materials, and wherein the one or more porous materials include metals, powders, or graphite.

13. The semiconductor package of claim 12, wherein the layer thermally couples the plurality of surfaces of the plurality of dies to the bottom surface of the lid of the IHS, wherein the bottom surface of the lid of the IHS faces the top surface of the package substrate and the plurality of surfaces of the plurality of dies, wherein the interior surface of the plurality of L-shaped sidewalls of the IHS faces the plurality of surfaces of the plurality of dies, wherein the plurality of L-shaped sidewalls of the IHS have a first portion and a second portion, wherein the first portion of the plurality of L-shaped sidewalls of the IHS extends horizontally over the top surface of the package substrate and a top surface of the substrate, wherein the second portion of the plurality of L-shaped sidewalls of the IHS extends vertically over the top surface of the substrate, and wherein the first portion of the plurality of L-shaped sidewalls of the IHS has a footprint greater than a footprint of the second portion of the plurality of L-shaped sidewalls of the IHS.

14. The semiconductor package of claim 13, further comprising:
  a hydrophobic layer on the plurality of surfaces of the plurality of dies and the top surface of the package substrate, wherein the hydrophobic layer is between the layer and the plurality of surfaces of the plurality of dies, wherein the hydrophobic layer is between the layer and the top surface of the package substrate, and wherein the hydrophobic layer is between the top surface of the package substrate and an exterior surface of the plurality of L-shaped sidewalls of the IHS;
  a liquid in the vapor chamber, wherein a portion of the liquid is in the layer;
  a thermal interface material (TIM) on the IHS;
  a heatsink on the TIM, wherein the TIM is positioned between the IHS and the heatsink;
  a plurality of bridges in the package substrate, wherein the plurality of bridges communicatively couple the plurality of dies to each other; and
  a plurality of solder balls couple the package substrate to the substrate.

15. The semiconductor package of claim 11, wherein the plurality of dies include a first die with a first thickness, and a second die with a second thickness, wherein the first thickness of the first die is different from the second thickness of the second die, and wherein the layer has a substantially uniform thickness or a non-uniform thickness.

16. The semiconductor package of claim 11, wherein the vapor chamber has a width greater than the width of the package substrate.

17. The semiconductor package of claim 14, wherein the liquid is comprised of water, water-based solutions, ethanol, methanol, or acetone, and wherein a region of the surface of the layer has a vertical sidewall or a tapered sidewall.

18. The semiconductor package of claim 15, wherein the first die has a first top surface, and the second die has a second top surface, wherein the layer has a first top surface positioned directly over the first top surface of the first die, wherein the layer has a second top surface positioned directly over the second top surface of the second die, wherein the first top surface of the layer is parallel to or coplanar to the second top surface of the layer, wherein the layer has a first thickness defined from the first top surface of the first die to the first top surface of the layer, wherein the layer has a second thickness defined from the second top surface of the second die to the second top surface of the layer, and wherein the first thickness of the layer is equal to or different from the second thickness of the layer.

19. A semiconductor package, comprising:
a package substrate on a substrate;
a bottom die on the package substrate;
a plurality of top dies on the bottom die;
an encapsulation layer on the bottom die, wherein the encapsulation layer surrounds the plurality of top dies;
a layer over the encapsulation layer, the plurality of top dies, the bottom die, and a top surface of the package substrate;
an integrated heat spreader (IHS) over the layer, wherein the IHS has a lid and a plurality of sidewalls; and
a sealant that couples the plurality of sidewalls of the IHS to the package substrate, wherein the layer is on a bottom surface of the lid of the IHS and an interior surface of the plurality of sidewalls of the IHS, wherein a vapor chamber is defined by the top surface of the package substrate, the bottom surface of the lid of the IHS, and the interior surface of the plurality of sidewalls of the IHS, and wherein the bottom surface of the lid of the IHS is exposed to the vapor chamber.

20. The semiconductor package of claim 19, wherein the vapor chamber is hermetically sealed with the sealant between the top surface of the package substrate and the plurality of sidewalls of the IHS, wherein the vapor chamber has a vapor space defined by a surface of the layer and the bottom surface of the lid of the IHS, wherein the layer is over a surface of the plurality of top dies and a surface of the bottom die, wherein the layer is comprised of one or more wick materials, wherein the one or more wick materials include one or more porous materials, and wherein the one or more porous materials include metals, powders, or graphite.

21. The semiconductor package of claim 20, wherein the layer thermally couples the surfaces of the plurality of top dies and the bottom die to the bottom surface of the lid of the IHS, wherein the bottom surface of the lid of the IHS faces the top surface of the package substrate and the plurality of surfaces of the plurality of dies, and wherein the interior surface of the plurality of sidewalls of the IHS faces the surface of the bottom die.

22. The semiconductor package of claim 21, further comprising:
a hydrophobic layer on the surfaces of the plurality of top dies and the bottom die, a surface of the encapsulation layer, and the top surface of the package substrate, wherein the hydrophobic layer is between the layer and the surfaces of the plurality of top dies and the bottom die, wherein the hydrophobic layer is between the layer and the top surface of the package substrate, and wherein the hydrophobic layer is between the layer and the surface of the encapsulation layer;
a liquid in the vapor chamber, wherein a portion of the liquid is in the layer;
a thermal interface material (TIM) on the IHS;
a heatsink on the TIM, wherein the TIM is positioned between the IHS and the heatsink;
a plurality of bridges in the package substrate, wherein the plurality of bridges communicatively couple the bottom die to the plurality of top dies; and
a plurality of solder balls couple the package substrate to the substrate.

23. The semiconductor package of claim 22, wherein the layer has a uniform thickness or a non-uniform thickness.

24. The semiconductor package of claim 22, wherein the liquid is comprised of water, water-based solutions, ethanol, methanol, or acetone, and wherein a region of the surface of the layer has a vertical sidewall or a tapered sidewall.

25. The semiconductor package of claim 22, wherein the plurality of top dies have the same thickness, and wherein the surface of the encapsulation layer is coplanar to the surface of the plurality of top dies.

26. A semiconductor package, comprising:
a die on a package substrate;
an integrated heat spreader (IHS) over the die and the package substrate, wherein the IHS has a lid and a plurality of sidewalls;
a sealant that couples the plurality of sidewalls of the IHS to the package substrate;
a layer below the lid of the IHS, wherein the layer is over the die and a top surface of the package substrate, and wherein the layer is on a bottom surface of the lid of the IHS and an interior surface of the plurality of sidewalls of the IHS, wherein a vapor chamber is defined by the top surface of the package substrate, the bottom surface of the lid of the IHS, and the interior surface of the plurality of sidewalls of the IHS, wherein the vapor chamber is hermetically sealed with the sealant between the top surface of the package substrate and the plurality of sidewalls of the IHS, and wherein the vapor chamber has a vapor space defined by a surface of the layer and the bottom surface of the lid of the IHS, wherein the layer is over a surface of the die, wherein the layer is comprised of one or more wick materials, wherein the one or more wick materials include one or more porous materials, and wherein the one or more porous materials include metals, powders, or graphite;
a hydrophobic layer on the surface of the die and the top surface of the package substrate, wherein the hydrophobic layer is between the layer and the surface of the die, and wherein the hydrophobic layer is between the layer and the top surface of the package substrate;
a liquid in the vapor chamber, wherein a portion of the liquid is in the layer;
a thermal interface material (TIM) on the IHS;
a heatsink on the TIM, wherein the TIM is positioned between the IHS and the heatsink;
a bridge in the package substrate, wherein the bridge communicatively couples the die and the package substrate; and
a plurality of solder balls couple the package substrate to a substrate.

* * * * *